US005893723A

United States Patent [19]
Yamanaka

[11] Patent Number: 5,893,723
[45] Date of Patent: Apr. 13, 1999

[54] MANUFACTURING METHOD FOR SEMICONDUCTOR UNIT

[75] Inventor: Hideo Yamanaka, Kanagawa, Japan

[73] Assignee: Sony Corporation, Japan

[21] Appl. No.: 08/519,353

[22] Filed: Aug. 25, 1995

[30] Foreign Application Priority Data

Aug. 31, 1994 [JP] Japan .................... 6-232111

[51] Int. Cl.⁶ .................... H01L 21/52; H01L 21/56; H01L 21/58; H01L 21/60
[52] U.S. Cl. .................... 438/65; 438/69; 438/116; 438/124; 438/126; 438/127; 264/272.17
[58] Field of Search .................... 257/790, 791; 438/65, 69, 116, 124, 126, 127; 264/272.17

[56] References Cited

U.S. PATENT DOCUMENTS

| | | | |
|---|---|---|---|
| 3,622,419 | 11/1971 | London | 156/242 |
| 4,318,939 | 3/1982 | Wong | 427/96 |
| 4,675,767 | 6/1987 | Osato et al. | 360/131 |
| 4,888,449 | 12/1989 | Crane et al. | 174/52.4 |
| 5,008,065 | 4/1991 | Okumura et al. | 264/331.17 |
| 5,043,211 | 8/1991 | Yoshizumi et al. | 428/331 |
| 5,070,041 | 12/1991 | Katayama et al. | 437/214 |
| 5,179,284 | 1/1993 | Kingsley et al. | 250/370.11 |
| 5,244,692 | 9/1993 | Zagdoun et al. | 427/126.3 |
| 5,366,806 | 11/1994 | Fujiki et al. | 428/412 |
| 5,474,828 | 12/1995 | Kouyama et al. | 428/76 |
| 5,554,569 | 9/1996 | Ganesan et al. | 437/207 |

*Primary Examiner*—David Graybill
*Attorney, Agent, or Firm*—Rader, Fishman & Grauer; Ronald P. Kananen

[57] ABSTRACT

A manufacturing method for a semiconductor unit which is capable of reducing the generation of a camber of a base member and enhancing reliability in operation. The method comprises the steps of: preparing a lead frame having an outer lead portion and an inner lead portion; preparing an upper mold and a lower mold for forming a cavity; holding the outer lead portion of the lead frame between the upper mold and the lower mold, and injecting molten resin in a cavity formed between the upper and lower molds and hardening the resin, thereby forming a base member having a recessed portion at its approximately central portion and a frame portion which surrounds the outside of an opening portion of the recessed portion and holds the inner lead portion of the lead frame between the base member and the frame portion; mounting a semiconductor device in the recessed portion, and connecting the semiconductor device to the inner lead of the lead frame; and potting a translucent resin in the recessed portion for sealing the semiconductor device.

19 Claims, 3 Drawing Sheets

MANUFACTURING METHOD FOR SEMICONDUCTOR UNIT

BACKGROUND OF THE INVENTION

1. Field of the Invention

The present invention relates to a manufacturing method for a semiconductor unit in which a package for mounting a semiconductor device is made of a resin.

2. Description of the Related Art

In a semiconductor unit requiring optical characteristics such as a CCD linear sensor, CCD area sensor, light emitting element and EPROM, a semiconductor device is contained in a translucent package to be protected from external disturbance.

In the case of a hollow ceramics package, a recessed hollow portion is provided in a base member made of ceramics at its approximately central portion, and a semiconductor device is mounted in the recessed hollow portion and is subjected to wiring by means of a wire bonding. After that, in such a state, a seal glass is bonded on the upper surface of the base member through a B stage sealer or A stage sealer for sealing the semiconductor device and the bonding wire.

In terms of reduction in cost, there has been proposed a semiconductor unit 10' as shown in FIG. 4A, which includes a hollow package having a base member 5 made of an epoxy resin. The semiconductor unit 10' including such a hollow package is manufactured as follows. A lead frame 3 is held between upper and lower molds, and in such a state, a cavity formed between the upper and lower molds is filled with an epoxy resin by transfer molding, to mold a base member 5 having a recessed portion 51 at its approximately central portion and a frame portion 6 on the base member 5. Next, after burring by blasting of beads or the like, a film of a nickel-gold alloy or the like is formed on an exposed outer lead portion and inner lead portion by electroplating.

A semiconductor device 7 is mounted in the recessed portion 51, and is connected to the lead frame 3 by means of a wire bonding 8. A seal glass 92 is then bonded to the upper surface of the frame portion 6 on the base member 5 through a B stage sealer or A sealer stage.

In this case, the epoxy resin used for molding the base member 5 of the hollow package is added with an additive for reducing a moisture absorption property of the epoxy resin. Alternatively, as shown in a sectional view of FIG. 4B, a semiconductor unit 10" is manufactured in a method wherein a pad portion 33 of the lead frame 3 subjected to a dipless process is buried in the base member 5 for preventing the permeation of moisture in the recessed portion 51.

In the above-described semiconductor unit including a hollow ceramics package, however, the processes of manufacturing a base member made of ceramics are complicated, so that it becomes very difficult to shorten a manufacturing time and to reduce a manufacturing cost.

The above-described semiconductor unit including a base member formed of an epoxy resin by transfer molding is advantageous in shortening a manufacturing time as compared with the hollow ceramics package; however, it is disadvantageous in that the camber of the base member after being molded (after hardening of the epoxy resin) becomes larger, thereby making it difficult to mount a semiconductor device at an accurate position and to air-tightly seal it by bonding a seal glass on the unit.

In the hollow package including the epoxy resin made base member, the burring is also required, and a cleaning operation for the molds becomes complicated. This reduces productivity, thereby making it difficult to reduce the manufacturing cost.

In particular, for a semiconductor unit in which a long-size semiconductor device must be mounted in a base member, such as a CCD linear sensor, the semiconductor device is difficult to mount at an accurate position because of the camber of the base member, thus exerting an adverse effect on the optical characteristics of the unit.

In the hollow package having the epoxy resin made base member, moreover, there is a fear that a semiconductor device causes malfunction due to radiation from impurities contained in the base member. To prevent this inconvenience, a refining cost for refining a material for the base member is increased, failing to reduce the manufacturing cost.

SUMMARY OF THE INVENTION

An object of the present invention is to provide a manufacturing method for a semiconductor unit which is capable of reducing a camber of a base portion and enhancing reliability in operation.

To achieve the above-object, according to a preferred mode of the present invention, there is provided a method of manufacturing a semiconductor unit, comprising the steps of: preparing a lead frame having an outer lead portion and an inner lead portion; preparing an upper mold and a lower mold for forming a cavity; holding the outer lead portion of the lead frame between the upper mold and the lower mold, and injecting molten resin in a cavity formed between the upper mold and a lower mold and hardening the resin, thereby forming a base member having a recessed portion at its approximately central portion and a frame portion which surrounds the outside of an opening portion of the recessed portion and holds the inner lead portion of the lead frame between the base member and the frame portion; mounting a semiconductor device in the recessed portion, and connecting the semiconductor device to the inner lead of the lead frame; and potting a translucent resin in the recessed portion for sealing the semiconductor device.

The resin may be a thermoplastic resin, preferably, one kind selected from a group consisting of a crystalline thermoplastic resin, noncrystalline thermoplastic resin, and a mixture of a crystalline thermoplastic resin and a noncrystalline thermoplastic resin.

The resin may be a silicone resin, preferably, either a liquid silicone resin or a paste silicone resin.

The resin may be a silicon resin added with a silane coupling agent, and in this case, the inner surfaces of the upper and lower molds may be coated with a film made of a fluororesin upon injection of the silicone resin.

The surface of the inner lead portion held between the base portion and the frame portion may be coated with a silane coupling agent upon injection of the silicone resin.

The surface of the translucent resin potted in the recessed portion may be coated with a conductive film having a hardness higher than that of the translucent resin, an optically non-reflective film having a hardness higher than that of the translucent resin, or an infrared ray shielding film having a hardness higher than that of the translucent resin.

In the present invention, a base portion and a frame portion are formed by a method wherein a lead frame is held between upper and lower molds and in such a state a thermoplastic resin is injected in a cavity formed between the upper and lower molds, and accordingly, cambers of the base portion and frame portion after being molded (after hardening of the resin) can be reduced as compared with the case using an epoxy resin.

Even in the case where the base portion and frame portion are formed by injecting a liquid or paste silicone resin in the cavity, cambers of the base portion and frame portions after being molded can be similarly reduced as compared with the case using an epoxy resin.

In the case of using the liquid or paste silicone resin, according to the present invention, a silane coupling agent is added into the liquid or paste silicone resin and the inner surfaces of molds contacted with the liquid or paste silicone resin are coated with a film of a fluororesin, or the surface of the inner lead portion held between the base portion and the frame portion is coated with a silane coupling agent, so that the releasability from the upper and lower molds can be improved while ensuring the adhesiveness of the lead frame to the base portion and the frame portion after being molded.

BRIEF DESCRIPTION OF THE DRAWINGS

FIGS. 1A to 1C are sectional views illustrating processes of manufacturing a semiconductor unit of the present invention in sequence, wherein FIG. 1A shows a clamping process; FIG. 1B shows a base member forming process; and FIG. 1C shows a trim and forming process;

FIGS. 2A and 2B are sectional views illustrating processes of manufacturing the semiconductor unit of the present invention in sequence; wherein FIG. 2A shows a mounting process; and FIG. 2B shows a potting process;

DETAILED DESCRIPTION OF THE PREFERRED EMBODIMENTS

Hereinafter, an embodiment of a manufacturing method for a semiconductor unit according to the present invention will be described in detail with reference to the drawings.

Figure 1A:
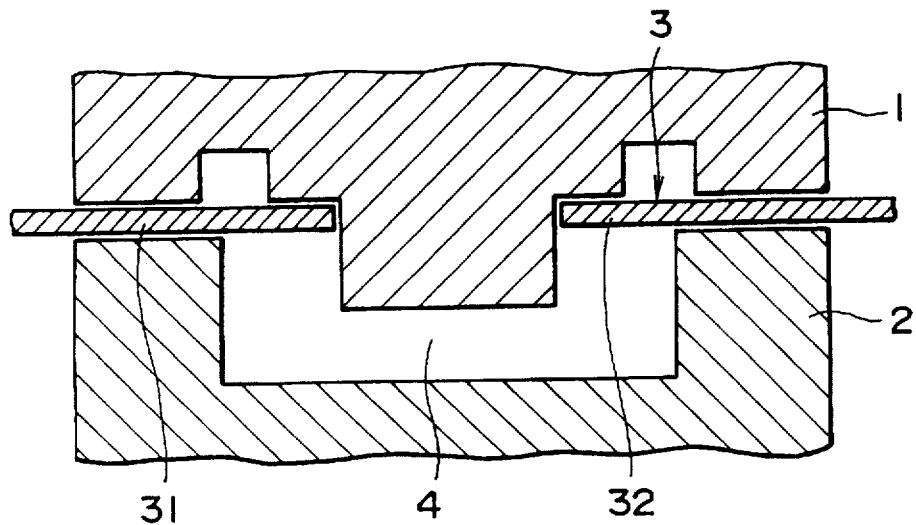
Figure 1B:
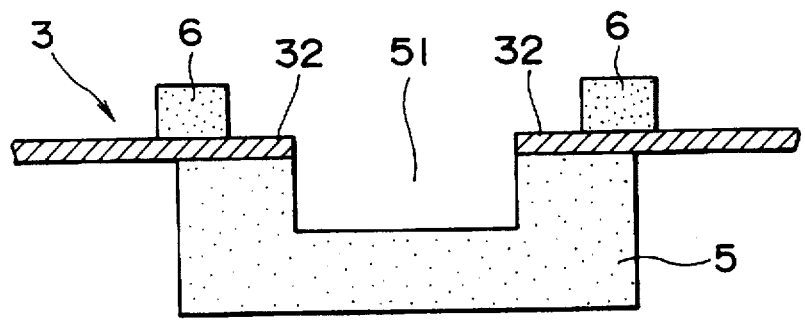
Figure 1C:
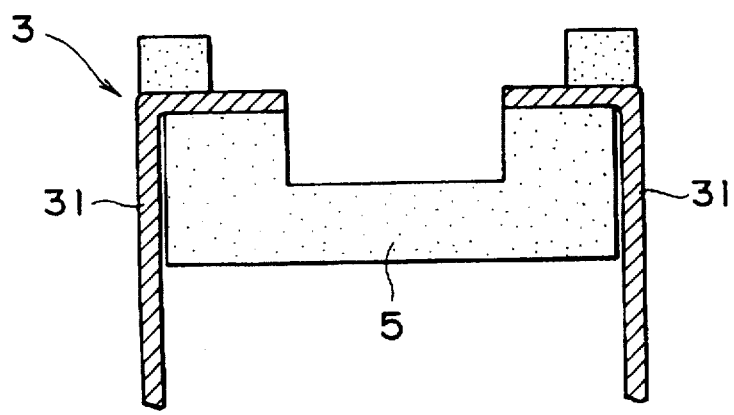
Figure 2A:
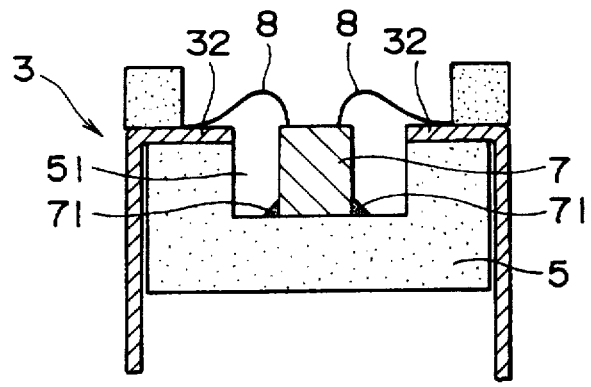
Figure 2B:
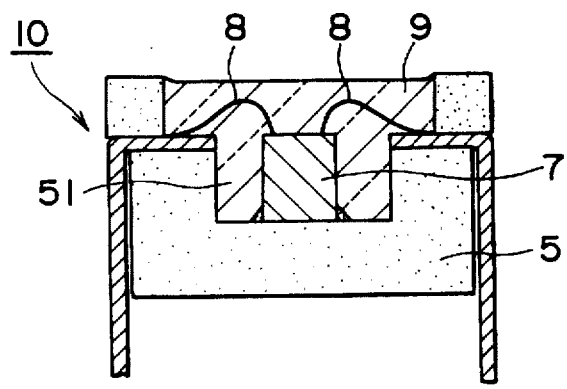

FIGS. 1A to 1C are sectional views illustrating processes of manufacturing a semiconductor unit of the present invention in sequence, and FIGS. 2A to 2C are sectional views illustrating processes of manufacturing the semiconductor unit of the present invention in sequence.

First, in a clamping process shown in FIG. 1A, an upper mold 1 and a lower mold 2 of an injection molding machine are clamped in such a manner as to hold an outer lead portion 31 of a lead frame 3 therebetween.

In this case, the lead frame 3 is preferably made of a metal material having a linear expansion coefficient nearly equal to that of the resin to be injected into a cavity 4 formed between the upper and lower molds 1, 2.

For example, in the case where a thermoplastic resin such as polyphenylene sulfide (hereinafter, referred to as "PPS") is used as the resin to be injected in the cavity 4, the lead frame 3 is preferably made of a material having a linear expansion coefficient nearly equal to that of the PPS, for example, copper or a copper alloy. On the other hand, for a thermoplastic resin such as a liquid crystal polymer, the lead frame 3 is preferably made of a 42 alloy (iron-42% nickel alloy).

In such a state that the lead frame 3 is held between the upper and lower molds 1 and 2, a resin is injected into the cavity 4.

Specific examples of the resins to be injected include a crystalline thermoplastic resin such as PPS, PCT (polycycloxyleneterephthalate), PBT (polybutyleneterephthalate), nylon (synthetic linear nylon) or liquid crystal polymer; a thermosetting resin such as liquid or paste silicone resin (hereinafter, referred to as "liquid silicone resin"); a noncrystalline thermoplastic resin such as a norbornane resin, polyolefine resin, or cyclic saturated hydrocarbon resin; and a mixture of a crystalline thermoplastic resin and a noncrystalline thermoplastic resin (hereinafter, referred to as "mixed resin").

The above-described PPS, PBT, PCT or nylon is added with glass fibers or inorganic fillers as needed; the liquid crystal polymer is added with glass fibers or carbon fibers as needed; and the noncrystalline thermoplastic resin is added with glass fibers or inorganic fillers as needed.

Each of the above-described resins is excellent in mechanical properties and heat resistance. For example, the resin has a liner expansion coefficient of about $1.0 \times 10^{-5}/°$ C. and a heat resistance capable of withstanding the dipping in a solder bath at 260° C. for 10 seconds. In addition, the resin is preferably low in water absorption ratio and also low in amounts of ionic impurities.

The liquid silicone resin may be of a type including a main agent and a hardening agent which is excellent in mechanical properties and heat resistance. In the liquid silicone resin of this type, burrs after molding can be eliminated by accurately controlling a pressure for supplying the main agent and hardening agent to an injecting molding machine, or by contriving the design in the molds.

The mixed resin may be a type of mixing PPS as a crystalline thermoplastic resin and a norbornane resin as a noncrystalline thermoplastic resin; or a type of mixing PPS and a cyclic saturated hydrocarbon resin or a polyolefine resin as a noncrystalline thermoplastic resin. Such a mixed resin is effective to suppress an excessive flow at a temperature over the melting point of PPS and to soften a reduction in flowability at a temperature under the melting point of PPS.

In other words, the mixed resin is effective to make easy the control of the cylinder temperature upon operation of an injection molding machine, and to enhance moldability and productivity more than in the case of using a single crystalline thermoplastic resin such as PPS.

The mixed resin may be added with glass fibers or inorganic fillers for improving mechanical properties and heat resistance.

Such a resin is injected in a cavity 4 and is then hardened, to thus form a base portion 5 and a frame portion 6.

Specifically, there are molded the base portion 5 having a recessed portion 51 at its approximately central portion, and the frame portion 6 which surrounds the outside of the opening portion of the recessed portion 51 and which holds the lead frame 3 between the base portion 5 and the same.

The use of such a resin enables the molding of the base portion 5 and the frame portion 6 being very smaller in camber than in the case of using an epoxy resin.

Compared with an epoxy resin, the PPS, liquid crystal polymer or mixed resin is advantageous in improving releasability from the upper and lower molds 1, 2 (see FIG. 1A), and in preventing the staying of duct in the cavity 4 after removal of the base member 5 and the frame portion 6 from the cavity 4 (see FIG. 1A). This is effective to make easy the maintenance of the upper and lower molds 1, 2.

A liquid silicone resin does not adhere well with the lead frame 3 as compared with the other resins, so that upon injecting it to the cavity 4 (see FIG. 1A), a silane coupling agent is added to the liquid silicone resin, and the inner surfaces of the portions of molds contacted with the liquid silicone resin, such as the cavity and a runner portion (not shown), are coated with a film of fluororesin. Alternatively, the surface of the inner lead portion 32 held between the base portion 5 and the frame portion 6 is previously coated with a silane coupling agent.

In the case where the silane coupling agent is added to the liquid silicone resin, the adhesiveness of the lead frame 3 to the base member 5 and the frame portion 6 can be improved; however, at the same time the adhesiveness of the lead frame 3 to the upper and lower molds 1, 2 (see FIG. 1A) is also enhanced. To cope with this inconvenience, the surfaces of the molds contacted with the liquid silicone resin, such as the cavity 4 (see FIG. 1A) and the runner portion (not shown), are coated with a film of fluororesin for enhancing the releasability.

In the case where a silane coupling agent is not added to the liquid silicone resin, the surface of the inner lead portion 32 held between the base portion 5 and the frame portion 6 is preferably coated with a silane coupling agent, with a result that the adhesiveness of the lead frame 3 to the base portion 5 and the frame portion 6 can be enhanced without harming the releasability of the liquid silicone resin.

In the case where the surface of the inner lead portion 32 is intended to be coated with the silane coupling agent, the whole surface of the lead frame 3 is previously coated with a silane coupling agent, the silane coupling agent coated on an unnecessary portion being removed by blasting in the subsequent process (for example, a burring process after molding of the base portion 5), and the inner lead portion 32 and the outer lead portion 31 of the exposed lead frame 3 are subjected to plating. In this plating, preferably, electroplating, a gold film having a thickness of from 0.5 to 0.6 μm is formed on a nickel film having a thickness of from 5 to 10 μm.

Alternatively, the whole surface of the lead frame 3 is previously subjected to plating, and the surface of the inner lead portion 32 held between the base portion 5 and the frame portion 6 is previously coated with a silane coupling agent.

Next,in a trim and forming process shown in FIG. 1C, the outer lead portion 31 of the lead frame 3 is cut into a specified length while a tiebar and resin are also cut, and then the outer lead portion 31 extending from the base portion 5 is folded into a specified shape.

After trim and forming of the outer lead portion 31, a semiconductor device 7 is mounted, as shown in FIG. 2A. The semiconductor device 7 is mounted in the recessed portion 51 of the base portion 5 through insulating paste 71. In this case, the insulating paste 71 and the like are hardened by curing at a temperature of 150° C. for one hour. In this mounting, since the camber of the base portion 5 is very small, the semiconductor device 7 can be certainly mounted at an accurate position. In particular, this is effective for a semiconductor unit such as a CCD linear sensor in which a long-size semiconductor device 7 is mounted.

The semiconductor device 7 is then connected to the inner lead portion 32 of the lead frame 3 by means of a bonding wire 8. A gold wire having a diameter of 23 to 25 μm is used for the bonding wire, and the wiring using such a gold wire is performed at 150° C.

Although both the mounting of the semiconductor device 7 and the wiring of the bonding wire 8 are performed at 150° C. the base portion 5 is not deformed at such a temperature because it is made of the above-described PPC, liquid crystal polymer, liquid silicone resin or mixed resin having a high heat resistance.

Next, in a potting process shown in FIG. 2B, a translucent resin 9 is potted at least in the recessed portion 51 of the base member 5. Specific examples of the translucent resins 9 include a thermosetting type resin such as a silicone resin, acrylic resin, epoxy resin; a ultraviolet radiation hardening type resin such as a silicone resin, acrylic resin, epoxy resin; and a ultraviolet radiation and heating hardening type resin such as a silicone resin, epoxy resin or acrylic resin.

The thermosetting type resin is heated and hardened at 150° C. for 3 to 4 hours (silicone resin), at 100° C. for 2 to 3 hours (acrylic resin), or at 120° C. for 3 to 4 hours (epoxy resin). On the other hand, the ultraviolet radiation hardening type resin such as a silicone resin, acrylic resin or epoxy resin is hardened by radiation of ultraviolet-rays at 2000 to 4000 mJ/cm$^2$.

The ultraviolet radiation and heating hardening type resin is hardened by radiation of ultraviolet-rays at 2000 to 4000 mJ/cm$^2$ and by heating at 150° C. for one hour (silicone resin), at 100° C. for one hour (acrylic resin) and at 120° C. for one hour (epoxy resin)

The semiconductor device 7 and the bonding wire 8 are thus sealed by the translucent resin 9.

A semiconductor unit 10 capable of protecting the semiconductor device 7 and the like from external disturbance without harming its optical characteristics can be thus accomplished. For example, even when radiations are generated from impurities such as glass fibers or inorganic fillers contained in the base member 5 and the frame portion 6 made of resin, they can be shielded by the translucent resin 9, thus making it possible to prevent the malfunction of the semiconductor element 7.

In the semiconductor unit 10 thus manufactured, the semiconductor device 7 can be mounted at an accurate position because of the reduced camber of the base portion 5 and the frame portion 6. In particular, in the case of a CCD linear sensor and CCD area sensor, the accurate matching of the optical axis can be achieved. Moreover, the semiconductor device 7 can be prevented from cracking, contributing to improvement in quality.

When being soldered to a mother board (not shown), for example, being dipped in a solder bath, the semiconductor unit is not deformed because the base portion 5 and the frame portion 6 is high in heat resistance.

Figure 3:
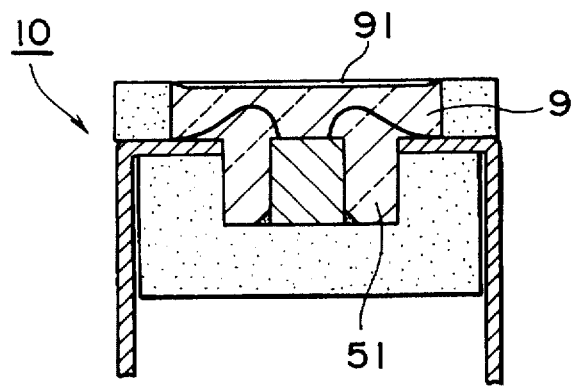
FIG. 3 is a sectional view showing surface coating.
Figure 4A:
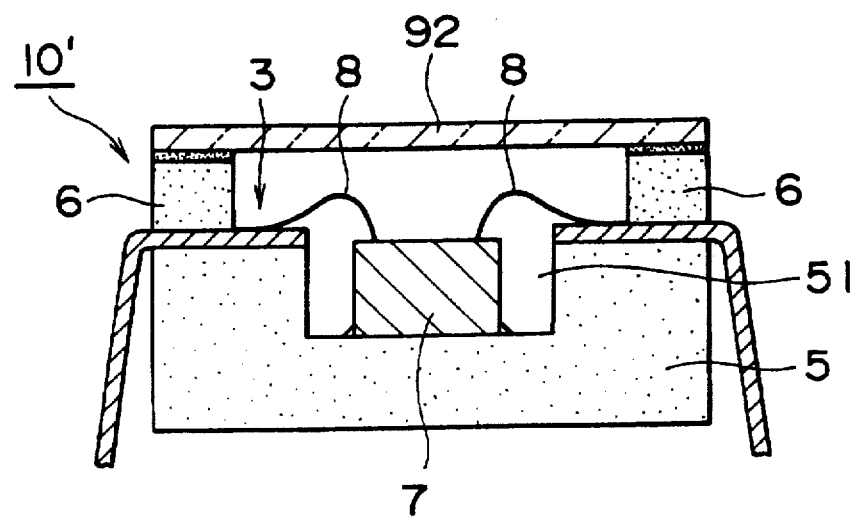
FIGS. 4A and 4B are sectional views illustrating semiconductor units according to the related art.
Figure 4B:
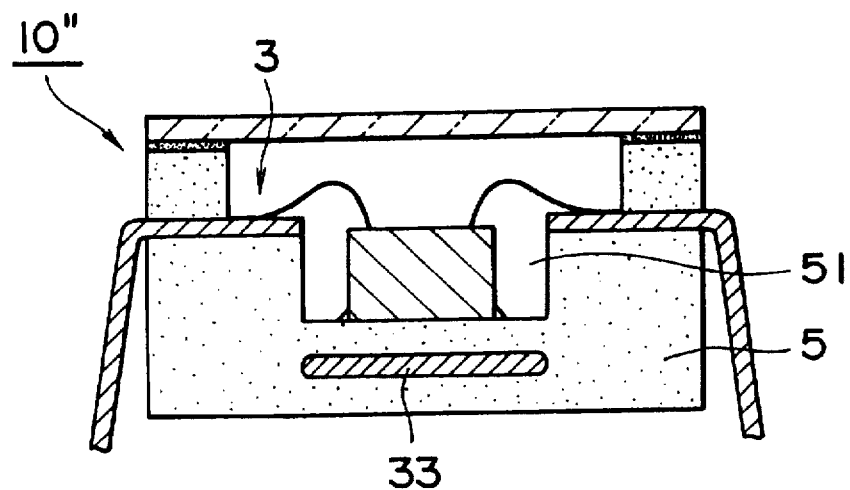

FIG. 3 is a sectional view showing an example of a surface coating. In this semiconductor unit 10, an exposed surface of the translucent resin 9 potted in the recessed portion 51 is coated with a thin film 91 having a hardness being at least higher than that of the translucent resin 9.

The thin film 91 comprises a translucent conductive coat, AR coat or IR coat, and which is formed, for example by sputtering ITO, SnO$_2$, (Sb), silicon oxide or titanium oxide.

The translucent conductive thin film 91 is effective to prevent the sticking of dust due to static electricity; the AR coat is effective to prevent the interference due to optical reflection; and the IR coat is effective for an optical infrared filter.

Either of these thin films 91 can prevent the exposed surface from being damaged because of its hardness higher than that of the translucent resin 9.

While not shown in the figure, instead of direct formation of the thin film 91 on the translucent resin 9, a glass or translucent plastic board subjected to the above-described coating may be bonded on the translucent resin 9.

Although the lead frame 3 (see FIG. 1A) is made of copper, a copper alloy, or 42 alloy in this embodiment, the present invention is not limited thereto. Namely, in the present invention, since the base portion 5 is forged of a thermoplastic resin, liquid silicone resin or mixed resin, the generation of burrs after molding of the base portion 5 can be reduced thereby simplifying the burring process, with a result that even in the case of using a lead frame previously applied with nickel-gold or nickel-palladium plating, there is no fear that the plating is peeled.

Consequently, the manufacturing cost can be reduced by the use of such a lead frame.

Although the description has been mainly made with reference to the CCD linear sensor, the present invention is not limited thereto, and can be applied to other semiconductor units such as a CCD area sensor, laser diode and EPROM.

In addition, the liner expansion coefficient, heat resisting temperature and processing conditions for the resin described in the embodiment are only for illustrative purposes but not restrictive.

What is claimed is:

1. A manufacturing method for a semiconductor unit, comprising the steps of:

preparing a lead frame having an outer lead portion and an inner lead portion;

preparing an upper mold and a lower mold for forming a cavity;

holding said outer lead portion of said lead frame between said upper mold and said lower mold, and injecting a first resin in a cavity formed between said upper and lower molds and hardening the resin, thereby forming a base member having a recessed portion and a frame portion which surrounds the outside of an opening portion of said recessed portion and holds said inner lead portion of said lead frame between said base member and said frame portion, wherein said first resin is a silicone resin, a crystalline thermoplastic resin, a noncrystalline thermoplastic resin or a mixture of a crystalline thermoplastic resin and noncrystalline thermoplastic resin;

mounting a semiconductor device in said recessed portion, and connecting said semiconductor device to said inner lead portion of said lead frame; and potting a second resin in said recessed portion for sealing said semiconductor device.

2. A manufacturing method for a semiconductor unit according to claim 1, wherein said first resin is polycycloxyleneterephthalate, polybutyleneterephthalate, or nylon.

3. A manufacturing method for a semiconductor unit according to claim 1, wherein said noncrystalline thermoplastic resin is norbornane, polyolefine or a cyclic saturated hydrocarbon.

4. A manufacturing method for a semiconductor unit according to claim 1, wherein said first resin is a silicone resins.

5. A manufacturing method for a semiconductor unit according to claim 4, wherein said silicone resin is a liquid silicone resin.

6. A manufacturing method for a semiconductor unit according to claim 4, wherein said silicone resin includes a silane coupling agent.

7. A manufacturing method for a semiconductor unit according to claim 6, wherein the inner surfaces of said upper and lower molds are coated with a film made of a fluororesin upon injection of said silicone resin.

8. A manufacturing method for a semiconductor unit according to claim 4, wherein the surface of said inner lead portion held between said base portion and said frame portion is coated with a silane coupling agent upon injection of said silicone resin.

9. A manufacturing method for a semiconductor unit according to claim 4, wherein the surface of said second resin potted in said recessed portion is coated with a conductive film having a hardness higher than that of said second resin.

10. A manufacturing method for a semiconductor unit according to claim 4, wherein the surface of said second resin potted in said recessed portion is coated with a film for preventing interference due to optical reflection, said film having a hardness higher than that of said second resin.

11. A manufacturing method for a semiconductor unit according to claim 4, wherein the surface of said second resin potted in said recessed portion is coated with an infrared ray shielding film having a hardness higher than that of said second resin.

12. A manufacturing method for a semiconductor unit according to claim 1, wherein the surface of said second resin potted in said recessed portion is coated with a conductive film having a hardness higher than that of said second resin.

13. A manufacturing method for a semiconductor unit according to claim 1, wherein the surface of said second resin potted in said recessed portion is coated with a film for preventing interference due to optical reflection, said film having a hardness higher than that of said second resin.

14. A manufacturing method for a semiconductor unit according to claim 1, wherein the surface of said second resin potted in said recessed portion is coated with an infrared ray shielding film having a hardness higher than that of said second resin.

15. A manufacturing method for a semiconductor unit, comprising the steps of:

preparing a lead frame having an outer lead portion and an inner lead portion;

preparing an upper mold and a lower mold for forming a cavity;

holding said outer lead portion of said lead frame between said upper mold and said lower mold, and injecting a first resin in a cavity formed between said upper and lower molds and hardening the resin, thereby forming a base member having a recessed portion and a frame portion which surrounds the outside of an opening portion of said recessed portion and holds said inner lead portion of said lead frame between said base member and said frame portion, wherein said first resin is a mixture of a crystalline thermoplastic resin and noncrystalline thermoplastic resin;

mounting a semiconductor device in said recessed portion, and connecting said semiconductor device to said inner lead portion of said lead frame; and potting a second resin in said recessed portion for sealing said semiconductor device.

16. A manufacturing method for a semiconductor unit according to claim 15, wherein the surface of said second resin potted in said recessed portion is coated with a conductive film having a hardness higher than that of said second resin.

17. A manufacturing method for a semiconductor unit according to claim 15, wherein the surface of said second resin potted in said recessed portion is coated with a film for preventing interference due to optical reflection, said film having a hardness higher than that of said second resin.

18. A manufacturing method for a semiconductor unit according to claim 15, wherein the surface of said second resin potted in said recessed portion is coated with an infrared ray shielding film having a hardness higher than that of said second resin.

19. A manufacturing method for a semiconductor unit according to claim 15, further comprising adding glass fibers or inorganic fillers to said first resin prior to said step of injecting.

* * * * *

UNITED STATES PATENT AND TRADEMARK OFFICE
CERTIFICATE OF CORRECTION

PATENT NO. : 5,893,723
DATED : April 13, 1999
INVENTOR(S) : Hideo YAMANAKA

It is certified that error appears in the above-identified patent and that said Letters Patent is hereby corrected as shown below:

Claim 4 should read:

4. A manufacturing method for a semiconductor unit according to claim 1, wherein said first resin is a silicone resin.

Signed and Sealed this

Twenty-seventh Day of July, 1999

Attest:

Q. TODD DICKINSON

*Attesting Officer*      *Acting Commissioner of Patents and Trademarks*